(12) United States Patent  
Chidambarrao et al.

(10) Patent No.: US 7,312,134 B2  
(45) Date of Patent: Dec. 25, 2007

(54) DUAL STRESSED SOI SUBSTRATES

(75) Inventors: Dureseti Chidambarrao, Weston, CT (US); Omer H. Dokumaci, Wappingers Falls, NY (US); Bruce B. Doris, Brewster, NY (US); Oleg Gluschenkov, Poughkeepsie, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/741,441

(22) Filed: Apr. 27, 2007

(65) Prior Publication Data

US 2007/0202639 A1 Aug. 30, 2007

Related U.S. Application Data

(62) Division of application No. 10/905,062, filed on Dec. 14, 2004.

(51) Int. Cl.  
  *H01L 21/84* (2006.01)
(52) U.S. Cl. .............................. 438/459; 257/E21.561
(58) Field of Classification Search ........ 438/455–459; 257/E21.561  
  See application file for complete search history.

(56) References Cited

U.S. PATENT DOCUMENTS

| | | | |
|---|---|---|---|
| 3,602,841 A | | 8/1971 | McGroddy |
| 4,317,125 A | * | 2/1982 | Hughes et al. ............. 257/275 |
| 4,665,415 A | | 5/1987 | Esaki et al. |
| 4,853,076 A | | 8/1989 | Tsaur et al. |
| 4,855,245 A | | 8/1989 | Neppl et al. |
| 4,952,524 A | | 8/1990 | Lee et al. |
| 4,958,213 A | | 9/1990 | Eklund et al. |
| 5,006,913 A | | 4/1991 | Sugahara et al. |
| 5,013,681 A | * | 5/1991 | Godbey et al. ............. 438/459 |
| 5,060,030 A | | 10/1991 | Hoke |
| 5,081,513 A | | 1/1992 | Jackson et al. |
| 5,108,843 A | | 4/1992 | Ohtaka et al. |
| 5,134,085 A | | 7/1992 | Gilgen et al. |

(Continued)

OTHER PUBLICATIONS

Ootsuka, et al. "A Highly Dense, High-Performance 130nm node CMOS Technology for Large Scale System-on-a-Chip Application", International Electron Device Meeting, 23.5.1, IEEE, Apr. 2000.

(Continued)

*Primary Examiner*—Richard A. Booth  
(74) *Attorney, Agent, or Firm*—Scully, Scott, Murphy & Presser, P.C.; Ira D. Blecker, Esq.

(57) ABSTRACT

The present invention provides a strained-Si structure, in which the nFET regions of the structure are strained in tension and the pFET regions of the structure are strained in compression. Broadly the strained-Si structure comprises a substrate; a first layered stack atop the substrate, the first layered stack comprising a compressive dielectric layer atop the substrate and a first semiconducting layer atop the compressive dielectric layer, wherein the compressive dielectric layer transfers tensile stresses to the first semiconducting layer; and a second layered stack atop the substrate, the second layered stack comprising an tensile dielectric layer atop the substrate and a second semiconducting layer atop the tensile dielectric layer, wherein the tensile dielectric layer transfers compressive stresses to the second semiconducting layer. The tensile dielectric layer and the compressive dielectric layer preferably comprise nitride, such as $Si_3N_4$.

10 Claims, 7 Drawing Sheets

U.S. PATENT DOCUMENTS

| | | | |
|---|---|---|---|
| 5,218,213 A * | 6/1993 | Gaul et al. ............... 257/55 |
| 5,234,535 A * | 8/1993 | Beyer et al. ............. 438/459 |
| 5,268,326 A * | 12/1993 | Lesk et al. ............. 438/406 |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,444,014 A * | 8/1995 | Ryum et al. ............. 438/311 |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy et al. |
| 5,592,007 A | 1/1997 | Leedy |
| 5,592,018 A | 1/1997 | Leedy |
| 5,670,387 A * | 9/1997 | Sun ....................... 438/155 |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,476,462 B2 | 11/2002 | Shimizu et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,878,611 B2 | 4/2005 | Sadana et al. |
| 6,884,667 B1 | 4/2005 | Doris et al. |
| 2001/0009784 A1 | 7/2001 | Ma et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2004/0029323 A1 | 2/2004 | Shimizu et al. |
| 2007/0010048 A1 | 1/2007 | Chen et al. |

OTHER PUBLICATIONS

Rim, et al. "Transconductance Enhancement in Deep Submicron Strained-Si n-MOSFETs", International Electron Devices Meeting, 26, 8, 1, IEEE, Sep. 1998.

Rim, et al. "Characteristics and Device Design of Sub-100 nm Strained Si N- and PMOSFETs", 2002, Symposium On VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Shimizu, et al. "Local Mechanical-Stress Control (LMC): A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

Ito, et al. "Mechanical Stress Effect of Etch-Stop Nitride and its Impact on Deep Submicron Transistor Design", International Electron Devices Meeting, 10.7.1, IEEE, Apr. 2000.

\* cited by examiner

DUAL STRESSED SOI SUBSTRATES

RELATED APPLICATIONS

This application is a divisional of U.S. patent application Ser. No. 10/905,062, filed Dec. 14, 2004.

FIELD OF THE INVENTION

The present invention relates to a semiconductor device and a method of forming a semiconductor device. The present invention is particularly concerned with semiconductor-on-insulator (SOI) technology and more specifically is directed to a structure and method for making a structure comprising silicon on a dual stressed material substrate.

BACKGROUND OF THE INVENTION

The integration of electronic microchip devices such as resistors, capacitors, fuses, diodes and transistors on a silicon substrate is the basis for integrated circuit (IC) wafer fabrication technology. The most popular IC technology, CMOS (complementary metal-oxide semiconductor), revolves around the improvements that have been made in FET (field-effect transistor) design and fabrication.

The FET is a voltage-amplifying device. The greatest advantage of the FET is its low voltage and low power requirements. Two basic types of FET are the metal-oxide (MOSFET) semiconductor and the junction (JFET). MOSFETS have been the mainstay transistor in IC products. There are two categories of MOSFETs: nMOS (n-channel) and pMOS (p-channel). Each MOSFET has an input electrode called the gate. The term "metal oxide" refers to the material the gate is made of. The most popular material used in the formation of gates for MOSFETs is polycrystalline silicon material that is deposited on the substrate during IC fabrication. Polycrystalline silicon must be doped with one of the common p-type or n-type dopants to give the material its conductive characteristics.

SOI technology and the advantages attributed thereto regarding CMOS integrated circuits are well documented. SOI technology involves silicon wafers having a thin layer of oxide buried therein. Semiconductor devices are built into the thin layer of silicon on top of the buried oxide. SOI substrates provide superior isolation between adjacent devices in an integrated circuit as compared to devices built into bulk wafers, since SOI technology eliminates latch-up as well as reduces parasitic capacitances. CMOS ICs fabricated with SOI technology have less active current consumption while maintaining device performance equivalent to that of similar devices formed on bulk-silicon (bulk-Si) substrates. SOI technology has become increasingly more common as the demand for battery-operated equipment increases due to its low power requirements at high speeds of SOI devices.

Many different techniques exist regarding the formation of SOI wafers. One of the more popular methods used to fabricate SOI substrates is separation by implantation of oxygen (SIMOX). SIMOX involves implanting oxygen ions into the silicon substrate to form the buried oxide layer. Layer transfer which includes wafer bonding is another technique employed for forming an isolation layer in a substrate. Forming silicon islands through a series of etch and oxidation steps can provide a lateral isolation structure.

In standard MOSFET technology, both channel length and gate dielectric thicknesses are reduced to improve current drive and switching performance. The carrier mobility of a MOSFET device is a critical parameter as it has direct influence on output current, as well as switching performance. Consequently, one can increase device performance by enhancing the channel mobility. Such enhancement has been provided in certain devices by providing a strain to the silicon film. A net strain can be provided by either compressive stress of the silicon film or tensile stress of the silicon film.

While there are many approaches to stress the silicon, the primary focus in the past has been on using abutting layers of nitride or other materials on the front end of the substrate. All of these have been direct etch/deposition approaches for SIMOX based SOI structures.

Further, many approaches to stress channels have primarily relied on creating the "same-sign" stress in the channel. In all these cases, the same-sign stress transfer occurs because the channel is in front of the film (for example, etch stop liner) edge. By "same sign" it is meant that the stress in the silicon channel will be tensile, if the film is tensile, and compressive, if the film is compressive.

In view of the above remarks, there is a need to provide a semiconducting device that combines the advantages of SOI technology with strain based device improvements.

SUMMARY OF THE INVENTION

The concept of the present invention is to stress the nFET and pFET islands of a SOI substrate with tension and compression, respectively, using an underlying material. The present invention combines silicon-on-insulator (SOI) technology with strain based device improvements. The present invention also reduces the incidence of threading and misfit dislocations that are typically present in relaxed Si on SiGe substrates. This is achieved in the present invention by providing a method of forming semiconductor islands on stressed material islands. These stressed islands, which are intrinsically compressive and tensile, impose "opposite-sign" tensile and compressive stresses, respectively, which are applied for nFETs and pFETs. The term "opposite-sign" denotes that the stress produced in the semiconductor islands is opposite that of the stress produced in the underlying material. For example, a tensile underlying material transfers a strain to the overlying semiconducting island producing a compressively strained semiconducting island, in which the tensile stress (+) within the tensile underlying material has a sign opposite the compressive stress (−) in the compressively strained semiconducting island. The stress transfer occurs in the overlying semiconductor islands upon release of the underlying stressed material by etching. One major benefit of this approach is that significant compressive stresses can be produced within the device channel of pFET devices.

The foregoing is achieved in the present invention by positioning a compressive dielectric layer or tensile dielectric layer underlying a semiconducting layer (semiconducting island). The term "compressive dielectric layer" denotes a dielectric layer having an intrinsic compressive stress. The term "tensile dielectric layer" denotes a dielectric layer having an intrinsic tensile stress.

The compressive dielectric layer transfers tensile strain to the overlying semiconducting layer. Therefore, the compressive dielectric layer provides strain based device improvements for n-type field effect transistors (nFETs). The tensile dielectric layer elastically transfers compressive strain to the overlying semiconducting layer. Therefore, the tensile dielectric layer provides strain based device improvements for p-type field effect transistors (pFETs). Broadly, the inventive strained-Si substrate comprises:

a substrate;

a first layered stack atop said substrate, said first layered stack comprising a compressive dielectric layer atop said substrate and a first semiconducting layer atop said compressive dielectric layer, wherein said compressive dielectric layer transfers tensile stresses to said first semiconducting layer; and a second layered stack atop said substrate, said second layered stack comprising a tensile dielectric layer atop said substrate and a second semiconducting layer atop said tensile dielectric layer, wherein said tensile dielectric layer transfers compressive stresses to said second semiconducting layer.

The compressive dielectric layer and the tensile dielectric layer preferably comprise a nitride, such as $Si_3N_4$. The compressive dielectric layer comprises a compressive intrinsic stress ranging from about 1400 MPa to about 2600 MPa and transfers a tensile stress ranging from about 200 MPa to about 350 MPa to the first semiconducting layer overlying the compressive dielectric layer. Therefore, the first semiconductor layer is optimized for nFET devices.

The tensile dielectric layer comprises a tensile intrinsic stress ranging from about 1000 MPa to about 1600 MPa and transfers a compressive stress ranging from about 150 MPa to about 200 MPa to the second semiconducting layer overlying the tensile dielectric layer. Therefore, the second semiconductor layer is optimized for pFET devices.

Another aspect of the present invention is a method for forming the above described strained-Si substrate. Broadly, in a first embodiment of the present invention, the inventive method for forming a strained-Si substrate comprises the steps of:

forming a compressive dielectric layer on a first portion of a substrate;

forming a tensile dielectric layer on a second portion of a substrate;

forming a semiconducting layer atop said compressive dielectric layer and said tensile dielectric layer; and forming an isolation region through said semiconducting layer and separating said tensile dielectric layer from said compressive dielectric layer, wherein said compressive dielectric layer transfers a tensile stress to a portion of said semiconducting layer overlying said compressive dielectric layer and said tensile dielectric layer transfers a compressive stress to a portion of said semiconducting layer overlying said tensile dielectric layer.

The compressive dielectric layer and the tensile dielectric layer comprise a nitride, such as $Si_3N_4$. The compressive dielectric layer may be deposited by chemical vapor deposition, wherein the conditions of said chemical vapor deposition provide an intrinsic compressive stress within the deposited layer. The conditions for depositing a compressive dielectric layer of $Si_3N_4$ by chemical vapor deposition include a low frequency power on the order of about 500 to about 1,500 W, a high frequency power on the order of about 250 to about 500 W, a silane flow rate on the order of about 800 to about 2,000 sccm, an $NH_3$ flow rate on the order of about 6,000 to about 10,000 sccm, and a deposition pressure of about 10 Torr or less.

The tensile dielectric layer may be deposited by chemical vapor deposition of a nitride, such as $Si_3N_4$, wherein the conditions of said deposition process provide an intrinsic tensile stress within the deposited layer. The conditions for depositing a tensile dielectric layer by chemical vapor deposition include a low frequency power on the order of about 0 to about 100 W, a high frequency power on the order of about 200 to about 600 W, a silane flow rate of about 50 to about 200 sccm, an $NH_3$ flow rate on the order of about 1,500 to about 3,000 sccm, and a deposition pressure of about 15 Torr or less.

In a second embodiment of the present method, a strained-Si substrate is formed by a method comprises the steps of:

providing an initial structure comprising a substrate having a tensile dielectric positioned on a first surface of said substrate and a compressive dielectric positioned on a second surface of said substrate, said tensile dielectric and said compressive dielectric separated by an insulating material;

removing said insulating material to expose a portion of said substrate between said first surface and said second surface of said Si-containing substrate;

recessing said portion of said substrate from said first and said second surface of said substrate to provide recessed portions of said substrate adjacent said first surface of said substrate and said second surface of said substrate;

forming an oxide positioned on recessed portions of said substrate, said oxide deposited to a thickness coplanar to an upper surface of said compressive dielectric and said tensile dielectric to provide a planar top surface;

bonding a wafer to said planar top surface of said oxide;

implanting said substrate to provide a damaged interface;

separating said substrate about said damaged interface, wherein a damaged surface of said substrate remains;

planarizing said damaged surface of said substrate stopping on a surface of said oxide on said recessed portions of said substrate, wherein planarizing said substrate to said oxide produces a semiconducting layer atop said tensile dielectric and said compressive dielectric; and removing said oxide, wherein said tensile dielectric transfers a compressive stress to said semiconducting layer overlying said tensile dielectric and said compressive dielectric transfers a tensile stress to said semiconducting layer overlying said compressive dielectric.

The compressive dielectric and the tensile dielectric can comprise a nitride, such as $Si_3N_4$. The initial structure is formed by providing layer of insulating material atop the substrate; removing a portion of the layer of insulating material to expose the first surface of the substrate and the second surface of the substrate; and forming the tensile dielectric atop the first surface of the substrate and the compressive dielectric atop the second surface of the substrate.

In one embodiment of the above method, a polysilicon cap may be formed atop the compressive dielectric and the tensile dielectric prior to removing the oxide positioned between the compressive dielectric and the tensile dielectric. The polysilicon cap may be removed, after removing the insulating layer, wherein the polysilicon cap maintains stress within the compressive dielectric and tensile dielectric.

DETAILED DESCRIPTION OF THE DRAWINGS

Figure 1A:
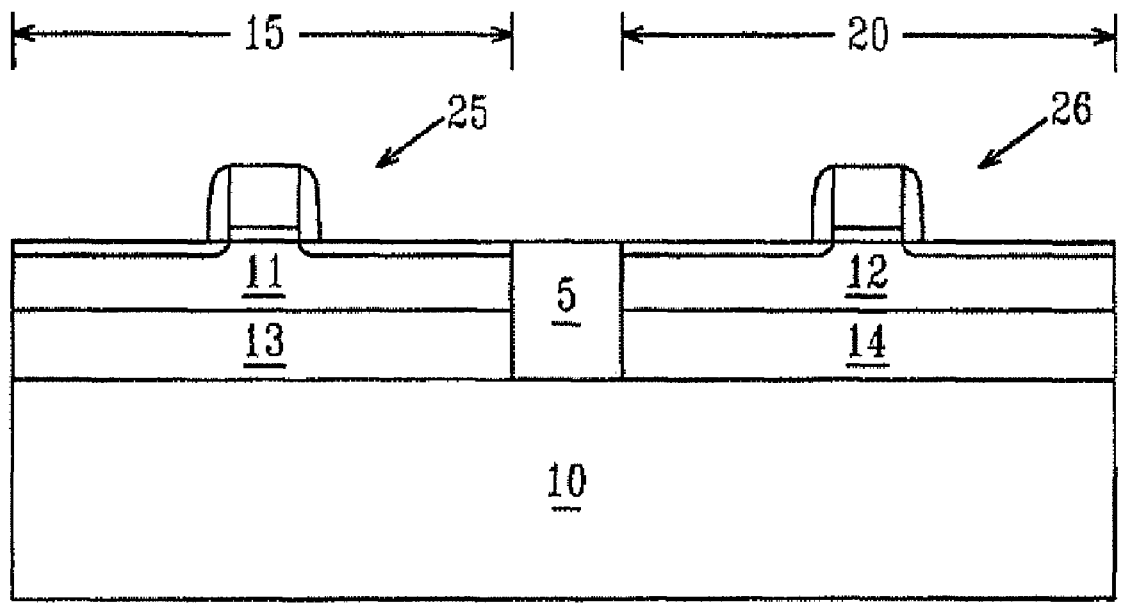
FIG. 1(A) illustrates (through a cross-sectional view) one embodiment of the present invention including a SOI substrate having a compressively strained semiconducting layer and a tensile strained semiconducting layer.

The present invention provides substrates comprising both a compressively strained semiconducting portion and a tensile strained semiconducting portion, and a method of forming the same.

The present invention advantageously provides substrates having both compressively strained and tensile strained semiconducting portions by forming a first and second material stack atop a substrate, in which the first material stack comprises a compressive dielectric layer that transfers a tensile strain to an overlying semiconducting portion and the second material stack comprises a tensile dielectric layer that transfers a compressive strain to an overlying semiconducting portion. The present invention provides a SOI substrate having differently strained surfaces for nFET and pFET devices. It is advantageous for nFETs to have a channel region that is strained in tension and for pFETs to have a channel that is strained in compression, where the strain applied to the channel improves the device's performance. The present invention is now discussed in more detail referring to the drawings that accompany the present application. In the accompanying drawings, like and or corresponding elements are referred to by like reference numbers.

Referring to FIG. 1(A), in one embodiment of the present invention, a substrate 10 is provided having an nFET region 15 and a pFET region 20. The nFET region 15 includes an nFET stack comprising a compressively strained dielectric layer 13 that transfers a tensile strain to an overlying tensile strained semiconducting layer 11. The pFET region 20 includes a pFET stack comprising a tensile strained dielectric layer 14 that transfers a compressive strain to an overlying compressively strained semiconducting layer 12. An isolation region 5 separates the nFET region 15 and the pFET region 20.

The compressively strained and tensile strained dielectric layers 13, 14 are the buried insulating layer of a silicon-on-insulator (SOI) substrate. In the preferred embodiment of the present invention, the compressively strained and tensile strained dielectric layers 13, 14 are silicon nitride ($Si_3N_4$) and have a thickness ranging from 50 nm to about 150 nm. The compressively strained and tensile strained dielectric layers are deposited by chemical vapor deposition, such as rapid thermal chemical vapor deposition (RTCVD) or plasma enhanced chemical vapor deposition (PECVD), and the strain produced within the deposited layer is a dependent on the processing conditions of the deposition process. These processing conditions are further discussed in greater detail with reference to FIGS. 4(A)-(C).

Referring back to FIG. 1(A), the tensile strained semiconducting layer 11 and compressively strained semiconducting layer 12 is the upper silicon-containing layer, also referred to as SOI layer, of the silicon-on-insulator (SO) substrate. The tensile strained semiconducting layer 11 is under a tensile stress, ranging from about 100 MPa to about 2200 MPa, and is therefore well suited to be the channel region of at least one nFET device 25. The compressive strained semiconducting layer 12 is under a compressive stress, ranging from about 100 MPa to about 2300 MPa, and is therefore well suited to be the channel region of at least one pFET device 26.

Figure 2:
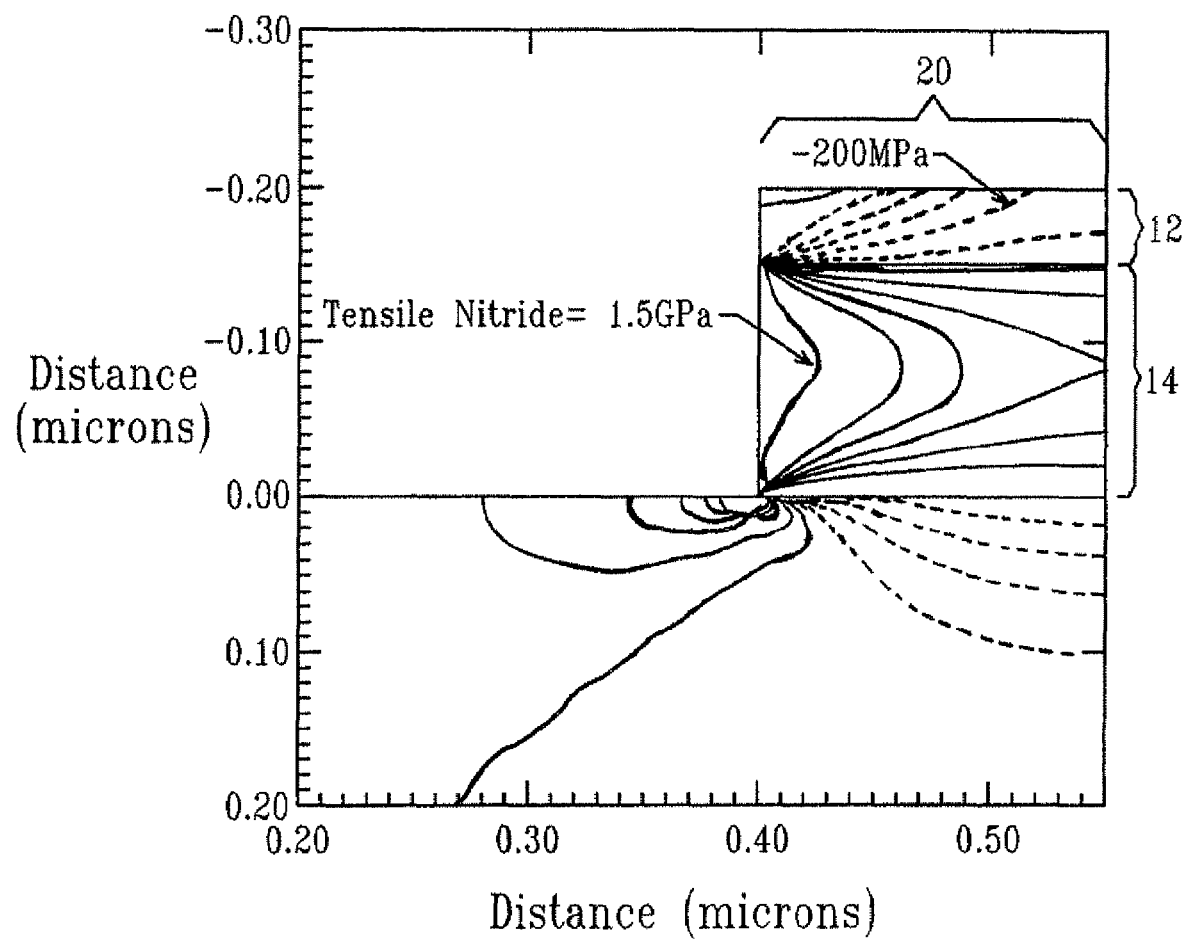
FIG. 2 depicts (through a cross-sectional view) the compressive and tensile stresses of one embodiment of the present invention having a material stack comprising a tensile dielectric layer.

Referring to FIG. 2, a simulation of one embodiment of a pFET stack within the pFET region 20 of the present invention is provided, where the solid lines represent stress in tension and the dotted lines represent stress in compression. In the simulation depicted, a tensile strained dielectric layer 14 comprising $Si_3N_4$ is formed having a thickness on the order of 250 Å, in which the intrinsic tensile stress produced within the $Si_3N_4$ tensile strained dielectric layer 14 is on the order of about +1.5 GPa. Still referring to FIG. 2, the tensile strained dielectric layer 14 elastically transfers a compressive stress, on the order of −200 MPa, to the overlying compressively strained semiconducting layer 12. Typically, the tensile strained dielectric layer 14 transfers 20% of its intrinsic stress to the overlying compressively strained semiconducting layer 12. The compressively strained semiconducting layer 12 comprises a silicon-containing layer having a thickness on the order of about 250 Å, in which the compressively strained semiconducting layer 12 is formed using layer transfer and bonding techniques.

Figure 3:
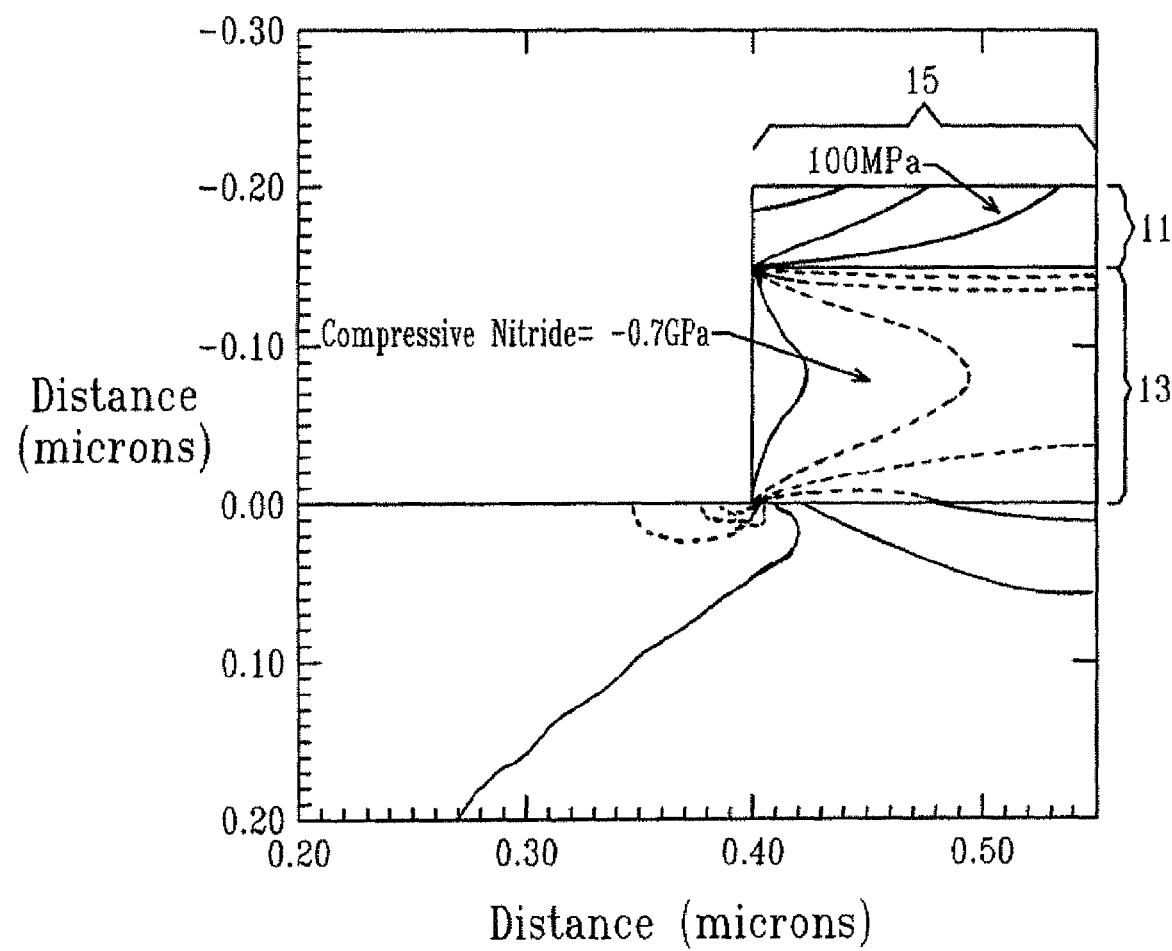
FIG. 3 depicts (through a cross-sectional view) the compressive and tensile stresses of one embodiment of the present invention having a material stack comprising a compressive dielectric layer.

Referring to FIG. 3, a simulation of one embodiment of an nFET stack within the nFET region 15 of the present invention is provided, where the solid lines represent stress in tension and the dotted lines represent stress in compression. In the simulation depicted, a compressively strained dielectric layer 13 comprising $Si_3N_4$ is formed having a thickness on the order of 250 Å, in which the intrinsic compressive stress produced within the $Si_3N_4$ compressive strained dielectric layer 13 is on the order of about −0.7 GPa. Typically, the compressively strained dielectric layer 13 transfers 20% of its intrinsic stress to the overlying tensile strained semiconducting layer 11. Still referring to FIG. 3, the $Si_3N_4$ compressively strained dielectric layer 13 elastically transfers a tensile stress, on the order of +100 MPa, to the overlying tensile strained semiconducting layer 11. The tensile strained semiconducting layer 11 is formed using layer transfer and bonding technique and typically has a thickness on the order of 250 Å.

Figure 1B:
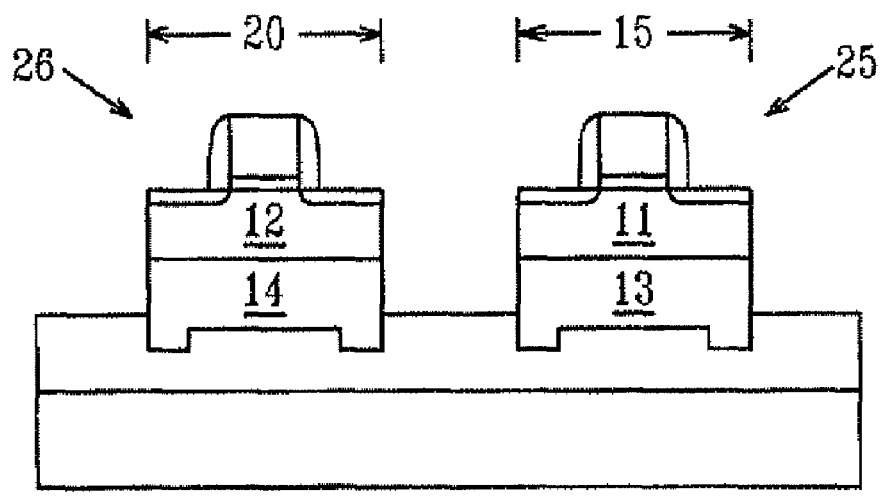
FIG. 1(B) illustrates (through a cross-sectional view) another embodiment of the present invention including a SOI substrate having a compressively strained semiconducting layer and a tensile strained semiconducting layer.

The method for forming a strained-Si substrate that simultaneously comprises both appropriately strained nFET and pFET regions 15, 20, is now discussed in greater detail. The method for forming appropriately strained nFET and pFET regions 15, 20 atop a silicon-on-insulator (SOI) substrate, as depicted in FIG. 1(A), is described with reference to FIGS. 4(A)-4(C). The method for forming appropriately strained nFET and pFET regions 15, 20 atop a silicon-on-insulator (SOI) substrate, as depicted in FIG. 1(B), is described with reference to FIGS. 5(A)-5(F).

Figure 4A:
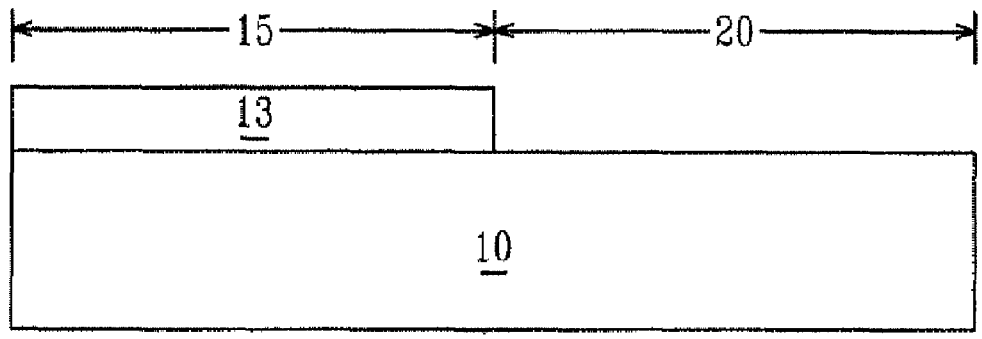
FIGS. 4(A)-4(C) illustrate (through cross-sectioned views) the process steps for producing the structure depicted in FIG. 1(A).

Referring to FIG. 4(A), a first strained dielectric layer 13 is formed atop a portion of a substrate 10. The substrate 10 preferably comprises a Si-containing material. The term "Si-containing" is used herein to denote a material that includes silicon. Illustrative examples of Si-containing materials include, but are not limited to: Si, SiGe, SiGeC, SiC, polysilicon, i.e., polySi, epitaxial silicon, i.e., epi-Si, amorphous Si, i.e., a:Si, and multilayers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenite.

The first strained dielectric layer 13 preferably comprises $Si_3N_4$ deposited under conditions that produce an internal stress within the deposited layer. Following blanket deposition the first strained dielectric layer 13 is then patterned and etched using conventional photolithography and etching, wherein the portion of the substrate 10 in which the first strained dielectric layer 13 remains is subsequently processed to provide the optimum conductivity type device for that surface.

The first strained dielectric layer 13 is first blanket deposited atop the entire substrate 10. The first strained dielectric layer 13 can be deposited using a low temperature chemical vapor deposition (CVD) process, such as plasma enhanced chemical vapor deposition (PECVD) or rapid thermal chemical vapor deposition (RTCVD). Modifying the process conditions used to deposit the first strained dielectric layer 13 can control whether the state of stress is tensile or compressive.

Plasma enhanced chemical vapor deposition (PECVD) can provide strained dielectrics having a compressive or tensile internal stress. The stress state of the strained dielectric layer deposited by PECVD can be controlled by changing the deposition conditions to alter the reaction rate within the deposition chamber More specifically, the stress state of the deposited strained dielectric layer may be set by changing the deposition conditions such as: $SiH_4/N_2/He$ gas flow rate, pressure, RF power, and electrode gap.

Rapid thermal chemical vapor deposition (RTCVD) can provide strained dielectric layer 11, 12 having an internal tensile stress. The magnitude of the internal tensile stress produced within the strained dielectric layer deposited by RTCVD can be controlled by changing the deposition conditions. More specifically, the magnitude of the tensile stress within the deposited strained dielectric layer may be set by changing deposition conditions such as: precursor composition, precursor flow rate and temperature.

In another embodiment, a block mask (not shown) can be formed atop portion of substrate 10, and then compressively strained dielectric layer 13 can be selectively deposited.

Figure 4B:
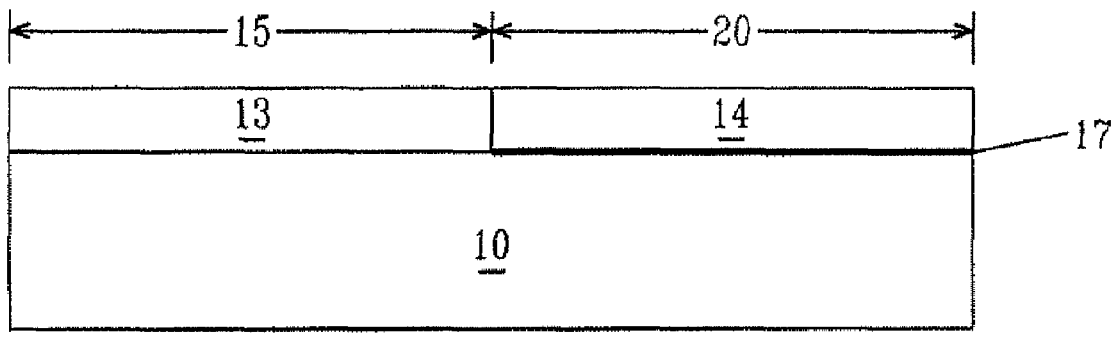
Figure 4C:
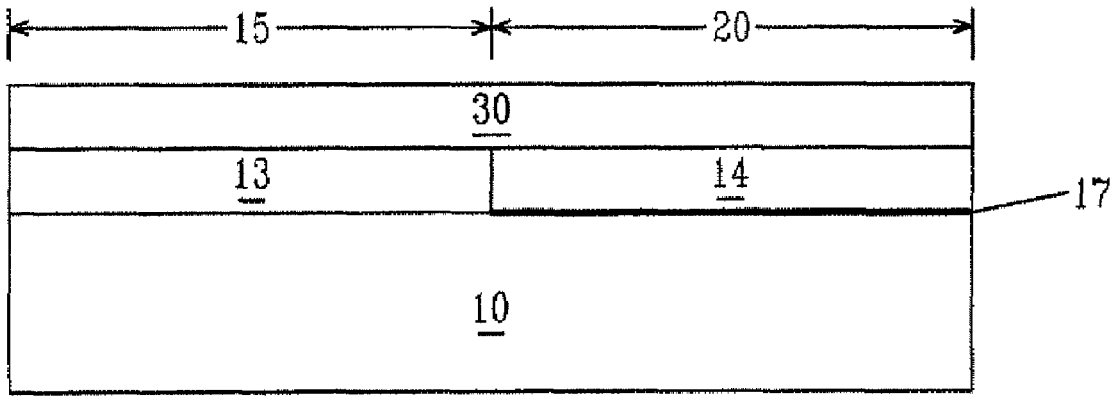

In the embodiment depicted in FIG. 4(A), the first strained dielectric layer 13 is preferably deposited under conditions to produce a compressively strained dielectric layer; hence the first strained dielectric layer depicted in FIGS. 4(A)-4(C) is hereafter referred to as a compressively strained dielectric layer 13. Compressively strained dielectric layer 13 formation can comprise PECVD of $Si_3N_4$, in which the deposition conditions include a low frequency power on the order of about 500 to about 1,500 W, a high frequency power on the order of about 250 to about 500 W, a silane flow rate on the order of about 800 to about 2,000 sccm, an $NH_3$ flow rate on the order of about 6,000 to about 10,000 sccm, and a deposition pressure of about 10 Torr or less. The compressively stressed dielectric 13 can be deposited to a thickness generally in the range from about 500 Å to about 1500 Å, with a range from about 500 to about 1000 Å being more typical.

In another embodiment of the present invention, the first strained dielectric can be $Si_3N_4$ deposited by PECVD under conditions to produce a tensile strained dielectric layer. The deposition conditions may include a low frequency power on the order of about 0 to about 100 W, a high frequency power on the order of about 200 to about 600 W, a silane flow rate of about 50 to about 200 sccm, an $NH_3$ flow rate on the order of about 1,500 to about 3,000 sccm, and a deposition pressure of about 15 Torr or less.

Following deposition, the compressively strained dielectric layer 13 is then patterned and etched using conventional photolithography and etching. Specifically, a pattern is produced by applying a photoresist to the surface of the compressively strained dielectric layer 13; exposing the photoresist to a pattern of radiation; and then developing the pattern into the photoresist utilizing a conventional resist developer. Once the patterning of the photoresist is completed, the sections of the compressively strained dielectric layer 13 covered by the photoresist are protected, while the exposed regions are removed using a selective etching process that removes the unprotected regions of the compressively strained dielectric layer 13 without substantially etching the underlying substrate 10. The portion of the substrate 10 in which the remaining portion of the compressively strained dielectric layer 13 is positioned is subsequently processed to provide nFET devices and is hereafter referred to as the nFET region 15. The portion of the substrate from which the compressively strained dielectric layer 13 was removed is hereafter referred to as the pFET region 20.

Referring to FIG. 4(B), an etch stop layer 17 is then blanket deposited atop the structure depicted in FIG. 4(A) including the exposed portion of the substrate 10 and the compressively strained dielectric layer 13. The etch stop layer 17 may comprise oxides, nitrides, and oxynitrides, preferably being an oxide, such as $SiO_2$. The etch stop layer 17 can have a thickness of between about 50 Å to about 200 Å, preferably being about 100 Å. The etch stop layer 17 may be formed using conventional deposition, such as chemical vapor deposition, or thermal growth processes, such as oxidation and nitration.

A second strained dielectric layer 14 is then blanket deposited atop the etch stop layer 17 using a chemical vapor deposition process, such as low temperature plasma enhanced chemical vapor deposition (PECVD) or rapid thermal chemical vapor deposition (RTCVD). Similar to the first strained dielectric layer deposition, modifying the process conditions for chemical vapor deposition of the second strained dielectric layer 14 can control whether the state of stress is tensile or compressive. In the embodiment depicted in FIG. 4(B), the second strained dielectric layer 14 is deposited under conditions to produce a tensile strained dielectric layer; hence the second strained dielectric layer 14 depicted in FIGS. 4(B)-4(C) is hereafter referred to as a tensile strained dielectric layer 14.

In one embodiment, tensile strained dielectric layer 14 formation comprises PECVD of $Si_3N_4$, in which the deposition conditions include a low frequency power on the order of about 0 to about 100 W, a high frequency power on the order of about 200 to about 600 W, a silane flow rate of about 50 to about 200 sccm, an $NH_3$ flow rate on the order of about 1,500 to about 3,000 sccm, and a deposition pressure of about 15 Torr or less.

The tensile stressed dielectric layer 14 can be deposited to a thickness generally in the range from about 500 Å to about 1500 Å, with a range from about 500 Å to about 1000 Å being more preferred.

In the embodiment of the present invention in which the first strained dielectric is deposited under conditions to produce a tensile strained dielectric layer, the second strained dielectric layer may be deposited under conditions to produce a compressive strained dielectric layer.

Following blanket deposition, the tensile strained dielectric layer 14 is then patterned and etched using conventional photolithography and etching. Specifically, a photoresist mask is formed protecting the pFET region 20 of the substrate 10, while leaving the nFET region 15 exposed. The tensile strained dielectric layer 14 is then removed from nFET region 15 by a highly selective etch that removes the tensile strained dielectric layer 14 without etching the underlying etch stop 17 or the photoresist mask overlying the pFET region 20. In a next process step, the etch stop layer 17 is removed from the nFET region 20 of the substrate 10 by an etch process, such as a wet or dry etching, having a high selectivity to removing the etch stop 17 without substantially etching the underlying compressively strained dielectric layer 13 or the photoresist mask. A chemical strip then removes the photoresist mask. In some embodiments, a planarizing process, such as CMP, may be utilized to provide a compressively strained dielectric layer 13 having an upper surface coplanar to the upper surface of the tensile strained dielectric layer 14, as depicted in FIG. 4(B).

In yet another embodiment, a block mask is first formed atop layer 13 and remains during formation of the etch stop layer 17 and the tensile strained dielectric layer 14.

Referring to FIG. 4(C), a semiconducting layer 30 is then formed atop the compressively strained dielectric layer 13 and the tensile strained dielectric layer 14 using conventional wafer bonding. For example, the semiconducting layer 30 may be transferred from a handling wafer (not shown), in which the semiconducting layer 30 is bonded to the coplanar surface of the compressively strained dielectric layer 13 and the tensile strained dielectric layer 14, wherein the handling wafer is removed following bonding via a smart cut process. Smart cut processing typically comprises forming a damaged interface by ion implantation, e.g., hydrogen implantation, and then removing the handling wafer at the damaged interface. The semiconducting layer 30 bonded to the planarized surface may be a silicon-containing material having a thickness ranging from about 5 nm to about 100 nm.

In a next process step, an isolation region 5 is then formed separating the nFET region 15 and the pFET region 20, as depicted in FIG. 1(A). Isolation regions 5 are formed by etching through the semiconductor layer 30, the compressively strained dielectric layer 13, and tensile strained dielectric layer 14 stopping on the substrate 10 surface, preferably stopping on the etch stop layer 17, to provide a trench. The trench may be formed using a pattered photoresist mask in conjunction with a dry etching process, such as reactive-ion etching (RIE) or plasma etching. The formation of the trench allows the strained dielectric layers 13, 14 to transfer the opposite-sign strain into the overlying semiconductor layer 30. For example the compressive strained dielectric 13 transfers a tensile strain into the overlying semiconducting layer producing a tensile strained semiconducting layer 11 (island) and the tensile strained dielectric 14 transfers a compressive strain into the overlying semiconducting layer producing a compressive strained semiconducting layer (island) 12. The intrinsic compressive stress produced within the compressive strained semiconducting layer 12 ranges from about 100 MPa to about 400 MPa, and the intrinsic tensile stress produced within the tensile strained semiconducting layer 11 ranges from about 100 MPa to about 400 MPa.

The trenches may optionally be lined with a conventional liner material, e.g., an oxide, and then CVD or another like deposition process is used to fill the trench with polysilicon or another like STI dielectric material. The STI dielectric may optionally be densified after deposition. A conventional planarization process such as chemical-mechanical polishing (CMP) may optionally be used to provide a planar structure.

Conventional nFET and pFET forming processes may then be conducted to form at least one nFET device 25 on the nFET region 15 and at least one pFET device 26 on the pFET region 20, as depicted in FIG. 1(A). It is noted that although only one device is depicted in each device region 25, 26, multiple devices are also contemplated and are within the scope of the present invention.

Figure 5A:
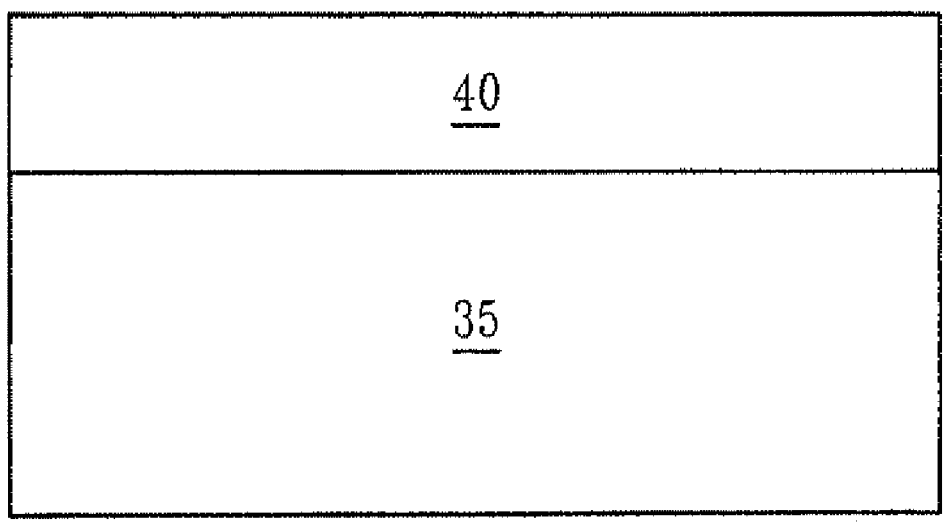
FIGS. 5(A)-5(F) illustrate (through cross-sectioned views) the process steps for producing the structure depicted in FIG. 1(B).

A second embodiment of the present invention, which produces the structure depicted in FIG. 1(B), is now described in with reference to FIGS. 5(A) to 5(F). Referring to FIG. 5(A), an initial structure is provided comprising an insulating material layer 40 atop a Si-containing wafer 35. The insulating material layer 40 may be an oxide, such as $SiO_2$, and is deposited atop a Si-containing wafer 35 by conventional deposition processes, such as chemical vapor deposition. The insulating material layer 35 can have a thickness ranging from about 10 nm to about 100 nm.

Figure 5B:
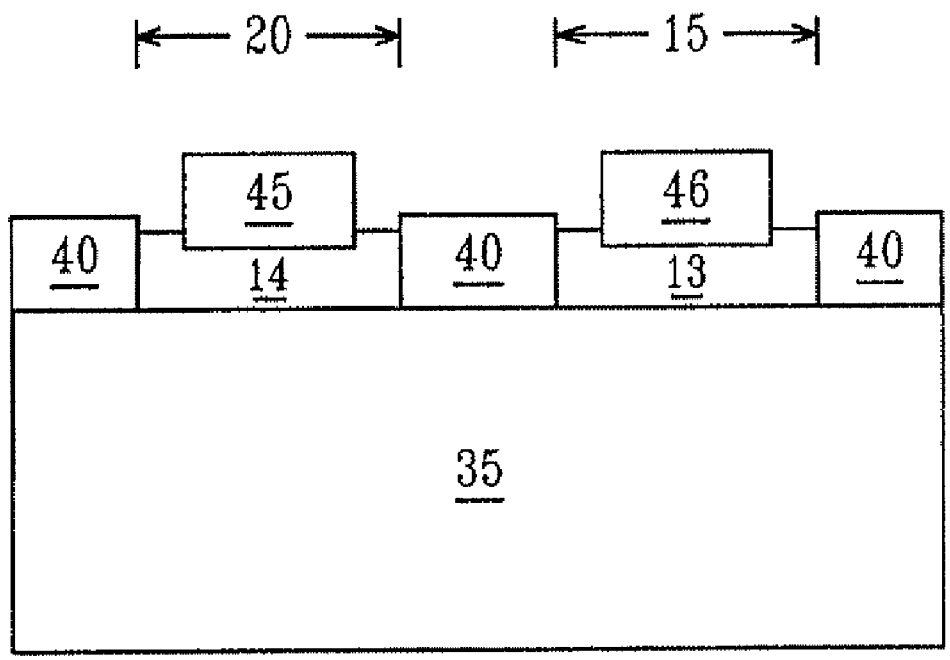

Referring to FIG. 5(B), in a first series of process steps, a pFET region 20 is formed within a portion of the initial structure. A first photoresist mask is formed atop the insulating material layer 40, wherein the first photoresist mask exposes a portion of the insulating material layer 40. The exposed portion of the insulating material layer 40 is then etched to expose a first surface of Si-containing wafer 35. Following the insulating material layer 40 etch, the first photoresist mask is chemically stripped. A first strained dielectric material 14 is then deposited atop at least the first surface of the Si-containing layer. The first strained dielectric material 14 has a tensile intrinsic stress and is hereafter referred to as a tensile strained dielectric layer 14. Similar to the tensile strained dielectric layer 14 formed in the previous embodiment, depicted in FIG. 4(B), the tensile strained dielectric layer 14 preferably comprises $Si_3N_4$ and is deposited by chemical vapor deposition, in which the conditions of the deposition process are selected to provide an intrinsic tensile stress within the deposited layer ranging from about 1000 MPa to about 2200 MPa.

Following deposition, another photoresist mask is formed protecting the portion of the tensile strained dielectric layer 14 within the pFET region 20 of the substrate 10, in which the exposed portion of the tensile strained dielectric layer 14 is removed from the nFET region 15 of the substrate 10 by an etch process having a high selectivity to the photoresist mask and the insulating material layer 40. Following etching, the photoresist is removed using a chemical strip.

A polysilicon layer is then blanket deposited and etched to from polysilicon caps 45 atop the tensile strained dielectric layer 14 within the pFET region 20. The polysilicon caps 45 are formed by deposition, such as chemical vapor deposition, and typically have a thickness ranging from about 20 nm to about 50 nm. The polysilicon cap 45 contributes to maintaining the intrinsic stress within the tensile strained dielectric layer 14 during subsequent processing.

Still referring to FIG. 5(B) and in a next series of process steps, an nFET region 15 is formed within a second portion of the initial structure. The processing of the nFET region 15 is similar to the processing of the pFET region 20. Specifically, a second portion of the insulating material 40 is removed to expose a second surface of the Si-containing wafer 35; a second strained dielectric material 13 having a compressive internal stress is blanket deposited and etched to provide a compressively strained dielectric layer 13 within the nFET region 15; and a polysilicon cap 46 is formed atop the compressively strained dielectric layer 13.

Similar to the compressive strained dielectric layer 13 formed in the previous embodiment depicted in FIG. 4(A), the compressive strained dielectric layer 13 preferably comprises $Si_3N_4$ and is deposited by chemical vapor deposition, in which the conditions of the deposition process are selected to provide an intrinsic compressive stress within the deposited layer ranging from about 1000 MPa to about 2600 MPa.

Figure 5C:
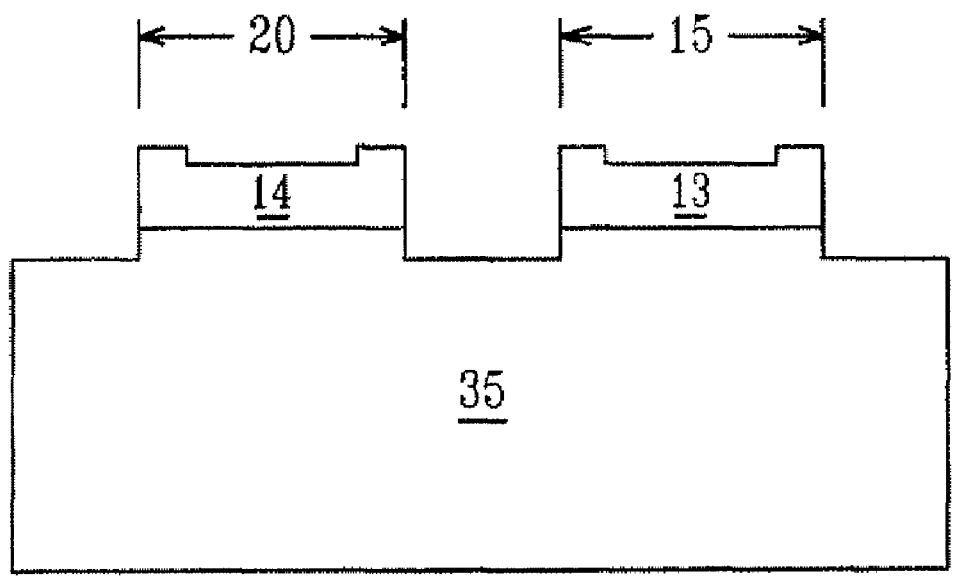

Referring to FIG. 5(C), in a next process step, the remaining portions of the insulating material layer 40 and the polysilicon caps 45, 46 are removed by an etch process, e.g., wet etch or dry etch, having a high selectivity to removing the insulating material layer 40 and the polysilicon caps 45, 46 without substantially etching the compressively strained dielectric layer 13 or the tensile strained dielectric layer 14. Removing the remaining portions of the insulating material layer 40 exposes the surface of the Si-containing wafer 35 between the compressively strained dielectric layer 13 and the tensile strained dielectric layer 14.

Still referring to FIG. 5(C), a directional etch process, such as reactive ion etch (RIE) having high selectivity to the compressively strained dielectric layer 13 and the tensile strained dielectric layer 14, vertically recesses the exposed surfaces of the Si-containing wafer 35. This etch process is timed. During this process step, a portion of the intrinsic strain within the compressively strained dielectric layer 13 and the tensile strained dielectric layer 14 is transferred onto the Si-containing wafer 35, wherein the strained dielectric layers 13, 14 impose the opposite sign strain on the Si-containing wafer 35.

Figure 5D:
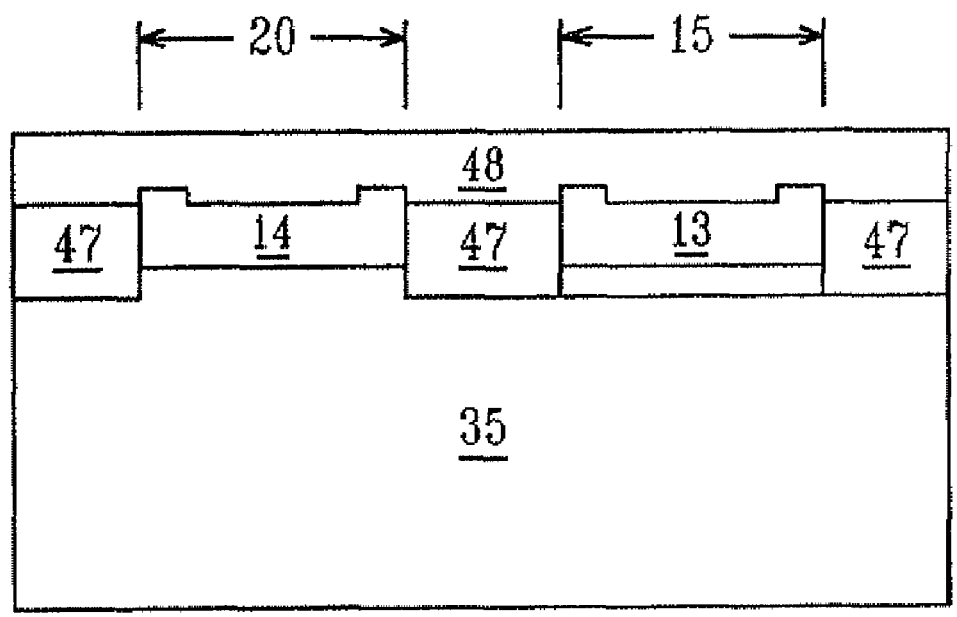

Referring to FIG. 5(D), a second oxide layer 47, e.g., $SiO_2$, is then deposited on the recessed surfaces of the Si-containing wafer 35 and is planarized, using chemical mechanical polishing, to be coplanar to the compressively strained dielectric layer 13 and the tensile strained dielectric layer 14. The upper surface of the second oxide layer 47 is then recessed from the coplanar surfaces of the compressively strained dielectric layer 13 and the tensile strained dielectric layer 14 by a high selective etch process. A planar upper surface polysilicon layer 48 is then formed atop the second oxide layer 47, compressively strained dielectric layer 13 and the tensile strained dielectric layer 14 using deposition and planarization processes.

Figure 5E:
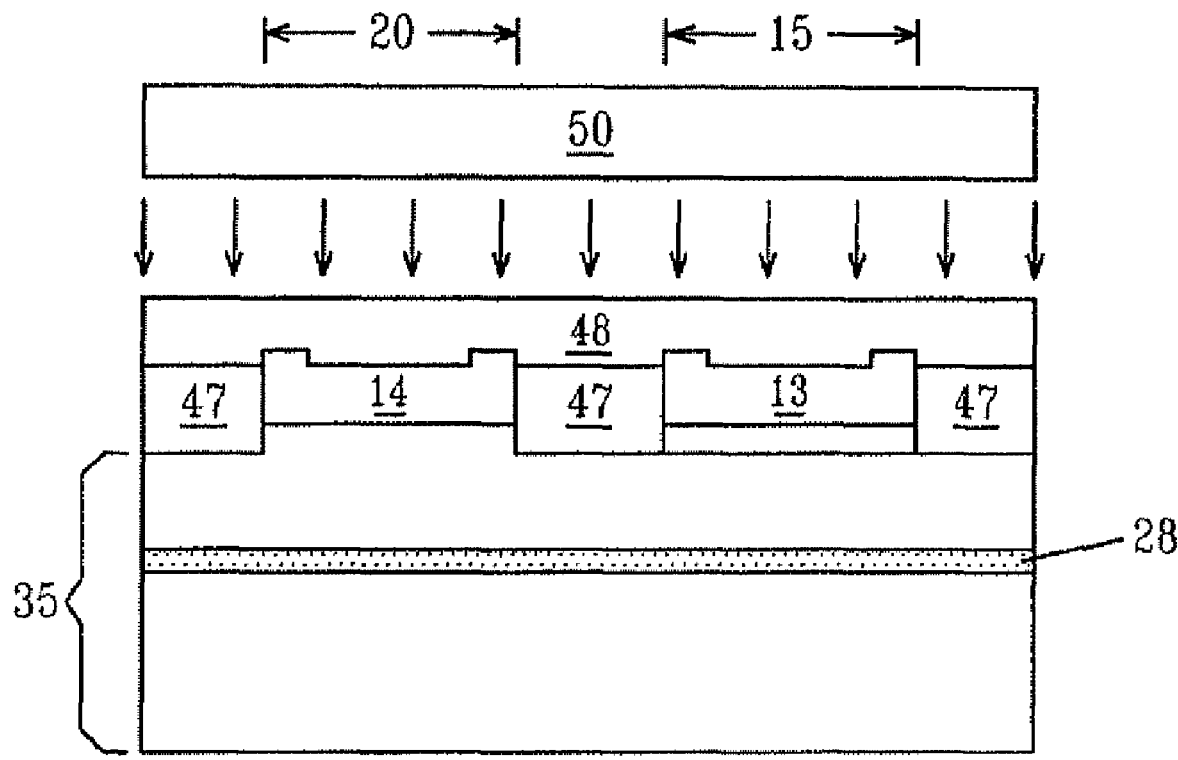
Figure 5F:
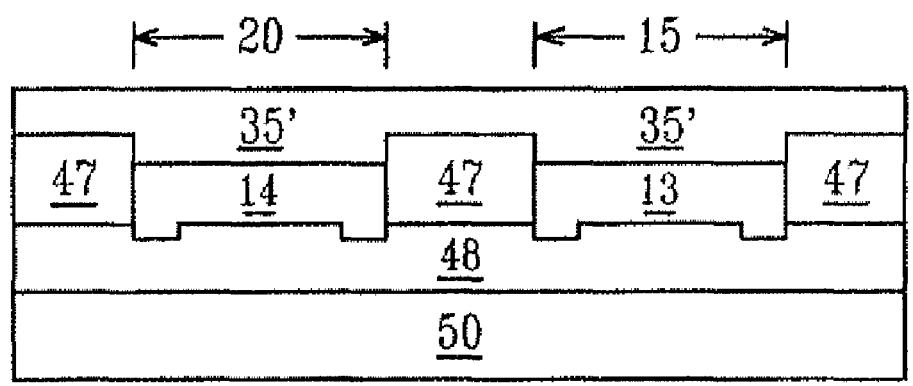

Referring to FIG. 5(E), in a next process step a damage interface 28 is formed within the Si-containing wafer 35 by implanting hydrogen ions, or other like ions, into the Si-containing wafer 35. Following the formation of the damaged interface 28, a handle wafer 50 is then bonded to the planar upper surface polysilicon layer 48. Bonding is achieved by bringing the handle wafer 50 into intimate contact with the face of the planar upper surface polysilicon layer 48; and then heating (room temperature or above) the two contacted surfaces under conditions that are capable of bonding. The heating step may be performed in the presence or absence of an external force. During bonding, the Si-containing wafer 35 is then separated about the damaged interface 28, in which a portion of the Si-containing wafer 35 positioned below the damaged interface 28 is removed and a portion of the Si-containing wafer 35' above the damaged interface 28 remains, as depicted in FIG. 5(F).

The remaining portion of the Si-containing wafer 35' are then subjected to a planarization process, such as chemical mechanical polishing (CMP) or grinding, stopping on the second oxide layer 47. Following planarization, the second oxide layer 47 is removed by a selective etch process that does not substantially etch the remaining portion of the Si-containing wafer 35'. FIG. 1(B) depicts the resultant structure formed by the above etch process.

Referring to FIG. 1(B), following removal of the second oxide layer 47, the compressive strained dielectric 13 transfers a tensile stress into the overlying remaining portion of Si-containing wafer producing a tensile strained semiconducting layer 11 (island), and the tensile strained dielectric 14 transfers a compressive stress into the overlying remaining portion of Si-containing wafer producing a compressive strained semiconducting layer (island) 12. The intrinsic compressive stress produced within the compressive strained semiconducting layer 12 ranges from about 100 MPa to about 300 MPa, and the intrinsic tensile stress produced within the tensile strained semiconducting layer 11 ranges from about 100 MPa to about 300 MPa.

In an alternative to compressive and tensile strained dielectrics 13, 14, the compressive film may be SiGe and the tensile film Si doped with carbon. Still further, one could employ Ge implantation into the compressive film to into a tensile film. For example, a compressive $Si_3N_4$ layer may be converted into a tensile film by implanting Ge by ion implantation, in which the implant concentration ranges from $5\times10^{14}$ atoms/cm$^3$ to about $1\times10^{16}$ atoms/cm$^3$ and the implantation energy ranging from about 10 keV to about 100 keV.

While this invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a substrate comprising:
    providing an initial structure comprising a Si-containing substrate having a tensile dielectric positioned on a first surface of said Si-containing substrate and a compressive dielectric positioned on a second surface of said Si-containing substrate, said tensile dielectric and said compressive dielectric separated by an insulating material;
    removing said insulating material to expose a portion of said Si-containing substrate between said first surface and said second surface of said Si-containing substrate;
    recessing said Si-containing substrate from said first and said second surface of said Si-containing substrate to provide recessed portions of said Si-containing substrate adjacent said first surface of said substrate and said second surface of said substrate;
    forming an oxide positioned on recessed portions of said Si-containing substrate, said oxide being coplanar to an upper surface of said compressive layer and said tensile layer to provide a planar top surface;
    bonding a wafer to said planar top surface;
    implanting said Si-containing substrate to provide a damaged interface;
    separating said Si-containing substrate about said damaged interface, wherein a damaged surface of said Si-containing substrate remains;
    planarizing said damaged surface of said Si-containing substrate stopping on a surface of said oxide on said recessed portions of said Si-containing substrate, wherein planarizing said Si-containing substrate to said oxide produces a semiconducting layer atop said tensile material and said compressive material; and removing said oxide, wherein said tensile dielectric transfers a compressive stress to said semiconducting layer and said compressive dielectric transfers a tensile stress to said semiconducting layer.

2. The method of claim 1 wherein providing said initial structure comprises:
providing a layer of said insulating material atop said Si-containing substrate;
removing a portion of said layer of insulating material to expose said first surface of said Si-containing substrate and a second portion of said layer of insulating material to expose said second surface of said Si-containing substrate; and
forming said tensile dielectric atop said first surface of said Si-containing substrate and said compressive dielectric atop second surface of said Si-containing substrate.

3. The method of claim 2 wherein said forming said compressive dielectric comprises chemical vapor deposition of $Si_3N_4$, wherein conditions of said chemical vapor deposition provide an intrinsic compressive stress within said compressive dielectric and said forming said tensile dielectric comprises chemical vapor deposition of $Si_3N_4$, wherein conditions of said chemical vapor deposition provide a intrinsic tensile stress within said tensile dielectric.

4. The method of claim 3 wherein said conditions of said chemical vapor deposition to provide said compressive dielectric comprise a low frequency power on the order of about 500 to about 1,500 W, a high frequency power on the order of about 250 to about 500 W, a silane flow rate on the order of about 800 to about 2,000 sccm, an $NH_3$ flow rate on the order of about 6,000 to about 10,000 sccm, and a deposition pressure of about 10 Torr or less.

5. The method of claim 3 wherein said conditions of said chemical vapor deposition to provide said tensile dielectric comprise a low frequency power on the order of about 0 to about 100 W, a high frequency power on the order of about 200 to about 600 W, a silane flow rate of about 50 to about 200 sccm, an $NH_3$ flow rate on the order of about 1,500 to about 3,000 sccm, and a deposition pressure of about 15 Torr or less.

6. The method of claim 2 further comprising:
forming polysilicon caps atop said compressive dielectric and said tensile dielectric prior to removing said insulating material; and
removing said polysilicon caps atop said compressive layer and said tensile layer after removing said insulating material, wherein said polysilicon caps maintain stress within said compressive layer and tensile layer.

7. The method of claim 1 further comprising implanting said compressive dielectric with Ge ions, wherein said implanting converts intrinsic compressive stress within said compressive dielectric to an intrinsic tensile stress.

8. The method of claim 7 wherein said Ge ions are implanted at a concentration ranging from about $5 \times 10^{14}$ atoms/cm$^2$ to about $1 \times 10^{16}$ atoms/cm$^2$.

9. The method of claim 1 wherein said compressive dielectric comprises an intrinsic compressive stress ranging from about 1000 MPa to about 2600 MPa and said tensile dielectric comprises an intrinsic tensile stress ranging from about 1000 MPa to about 2200 MPa.

10. The method of claim 1 wherein said compressive dielectric transfers said tensile stress ranging from about 100 MPa to about 300 MPa to said semiconducting layer overlying said compressive dielectric and said tensile dielectric transfers said compressive stress ranging from about 100 MPa to about 300 MPa to said semiconducting layer overlying said dielectric layer.

* * * * *